United States Patent
Ryckebusch et al.

(10) Patent No.: US 7,653,843 B2
(45) Date of Patent: *Jan. 26, 2010

(54) METHOD AND ARRANGEMENT TO ESTIMATE TRANSMISSION CHANNEL CHARACTERISTICS

(75) Inventors: Frank Ryckebusch, Ekeren (BE); Stan Claes, Mechelen (BE)

(73) Assignee: Alcatel, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 11/738,757

(22) Filed: Apr. 23, 2007

(65) Prior Publication Data

US 2007/0288806 A1    Dec. 13, 2007

Related U.S. Application Data

(63) Continuation of application No. 10/423,975, filed on Apr. 28, 2003, now Pat. No. 7,216,268, which is a continuation of application No. 09/523,581, filed on Mar. 10, 2000, now Pat. No. 6,606,719.

(30) Foreign Application Priority Data

Mar. 31, 1999    (EP)    .................................. 99400793

(51) Int. Cl.
    G01R 31/28    (2006.01)
    G01R 31/08    (2006.01)
(52) U.S. Cl. ........................................ 714/712; 370/242
(58) Field of Classification Search .................. 714/712, 714/715, 716, 708; 375/220, 227, 358, 310; 455/450; 370/242, 248, 252
See application file for complete search history.

(56) References Cited

U.S. PATENT DOCUMENTS

| | | | |
|---|---|---|---|
| 4,105,995 A | 8/1978 | Bothof et al. |
| 4,995,057 A | 2/1991 | Chung |
| 5,361,402 A | 11/1994 | Grube et al. |
| 5,410,536 A | 4/1995 | Shah et al. |
| 5,479,650 A | 12/1995 | Archibald et al. |
| 5,541,955 A | 7/1996 | Jacobsmeyer |
| 6,606,719 B1 | 8/2003 | Ryckebusch et al. |
| 6,765,957 B2 | 7/2004 | Palm |
| 6,865,232 B1 | 3/2005 | Isaksson et al. |

OTHER PUBLICATIONS

ANSI's T1.413 standard, issue 2, paragraph 9.9.8.1 draft edition, "Standards Project for Interfaces Relating to Carrier to Customer Connection of Asymmetric Digital Subscriber Line (ADSL) Equiopment".

(Continued)

Primary Examiner—Phung M Chung
(74) Attorney, Agent, or Firm—Sughrue Mion, PLLC

(57) ABSTRACT

A channel characteristic of a transmission channel between a remote terminal and a central office is estimated by collecting information in the remote terminal, transferring this information from the remote terminal to the central office and matching the received information at the central office with a channel and remote terminal simulation model. The values of parameters of the latter simulation model, which define the channel characteristic to be estimated, are determined as a result of the matching process. The information collected by the remote terminal typically is information that is automatically collected by the remote terminal for operational purposes, such as equalizer setting and bit allocation.

3 Claims, 2 Drawing Sheets

OTHER PUBLICATIONS

Nov. 2003 DSM Forum Talk in Paris (enclosed), Dynamic Spectrum Management.

T1E1.4 Contribution 2003-325 dated Dec. 8-12, 2003, (DSM) 2002.

T. Starr et al, DSL Advances, Prentice-Hall (2003 Edition).

George Ginis et al, "Vectored Transmission for Digital Subscriber Line Systems", IEEE JSAC special issue on twisted-pair transmission, vol. 20, Issue 5, pp. 1085-1104, Jun. 2002.

J. M. Cioffi, Chapter 4 "Generalized Decision-Feedback Equalization for Packet Transmission with ISI and Gaussian Noise" from *Communications, Control of Signal Processing: A Tribute to Thomas Kailath* (A. Paulraj et al, Ed.), Kluwer Academic Publishers, 1997.

T1E1.4 contribution 2002-069—Feb. 18, 2002.

T1E1.4 contribution 1992-203—Dec. 1, 1992.

A. Weissberger et al, "ADSL-DMT Out of Service Tests, Simplified Start-up Procedure(s), and Layer Management Protocols," Standards Project: ADSL Testing and Management, Brussels, Belgium; Sep. 16-17, 1997 (enclosed).

METHOD AND ARRANGEMENT TO ESTIMATE TRANSMISSION CHANNEL CHARACTERISTICS

This is a continuation of U.S. application Ser. No. 10/423,975 filed Apr. 28, 2003, which is a continuation of U.S. application Ser. No. 09/523,581 filed Mar. 10, 2000, now U.S. Pat. No. 6,606,719, the disclosures of which are incorporated herein by reference.

BACKGROUND OF THE INVENTION

The present invention relates to a method to estimate a transmission channel characteristic, a transmission channel characteristic estimating arrangement able to perform this method, and a related remote terminal.

Such a method to estimate a transmission channel characteristic and related equipment are already known in the art, e.g. from the U.S. Pat. No. 4,105,995, entitled 'Digitally Controlled Transmission Impairment Measurement Apparatus'. Typically, the operator needs knowledge of certain channel characteristics of a transmission channel between a central office and a remote terminal to be able to guarantee a certain service to a subscriber that has installed the remote terminal. The presence of line imperfections such as bridged taps, line attenuation, ageing effects, disturbers like radio frequency interference, and so on, has to be estimated by the operator before a certain quality of service can be guaranteed. To estimate all basic parameters necessary to characterise a transmission channel for its ability to carry data traffic, U.S. Pat. No. 4,105,995 describes a portable microprocessor controlled apparatus that measures specified parameters for a telephone channel. The known apparatus for channel characteristic estimation either consists of two units to be connected respectively to both ends of the transmission channel, or of a single unit to be connected to a single end of the transmission channel. The latter embodiment of the known channel characteristic estimating apparatus requires manual loop-back at the end of the transmission channel whereto the apparatus is not coupled. Summarising, U.S. Pat. No. 4,105,995 describes dedicated transmission channel test equipment enabling off-line measurement of channel characteristics. To apply the known technique, transmission of user data over the transmission channel has to be interrupted and test equipment has to be connected to the transmission channel either at one or at both sides of the channel.

SUMMARY OF THE INVENTION

It is an object of the present invention to provide a method for estimation of a transmission channel characteristic and related equipment similar to the above described one, but which allows both on-line and off-line channel characteristic estimation without the necessity to connect dedicated test equipment to the transmission channel.

According to the invention, this object is achieved by the method to estimate a transmission channel characteristic, the transmission channel characteristic estimating arrangement, and the remote terminal.

Indeed, the remote terminal itself collects all information required to estimate the transmission channel characteristic of interest and sends this information back to the central office wherein the information is matched with a simulation model of the transmission channel and remote terminal. The information collected by the remote terminal can be fed back in a multiplexed way simultaneously with user data so that the data traffic over the transmission channel does not have to be interrupted. The simulation model used in the central office for the matching process typically contains a number of parameters, e.g. the location along the transmission line of a bridged tap, corresponding to the transmission channel characteristics of interest. During the matching process, the values of these parameters are determined.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

Similarly, it is to be noticed that the term 'coupled', also used in the claims, should not be interpreted as being limitative to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

Indeed, the remote terminal of an Asymmetric Digital Subscriber Line (ADSL) system operating in accordance with ANSI's T1.413 standard, issue 2 for instance automatically collects information concerning the attenuation of a set of carriers with equidistant frequencies as can be deduced from paragraph 9.9.8.1 of the draft edition of issue 2 of ANSI's T1E1.413 standard, entitled 'Standards Project for Interfaces Relating to Carrier to Customer Connection of Asymmetric Digital Subscriber Line (ADSL) Equipment. This information is collected for use in the bit rate selection process described in paragraph 9.9.8.2 of the cited draft standard, and for use in the bit allocation process described in paragraph 9.9.14 of the cited draft standard, but in addition is very useful for estimating certain transmission channel characteristics such as the position of a bridged tap along the line. A preferred embodiment of the present invention consequently makes use of this automatically collected information for transmission channel characterisation.

Thus, by multiplexing the collected information that will be used for transmission channel characterisation with user data, a transmission channel can be characterised without interruption of the system. This is so because the remote terminal that is able to transmit the user data does not have to be replaced by test equipment.

Alternatively, a transmission channel characteristic is estimated off-line.

Thus, by interrupting transfer of user data over the channel and bringing the system into a test phase, a transmission channel characteristic according to the present invention can also be estimated off-line without the requirement to connect dedicated test equipment to the channel.

In this way, information indicative for the attenuation and phase rotation of carriers having different frequencies, such as is typically collected in a multi-carrier ADSL (Asymmetric Digital Subscriber Line) modem and used therein for setting equaliser coefficients, can additionally be used for channel characterisation.

In this way, information indicative for the noise affecting carriers having different frequencies, such as is typically collected in a multi-carrier ADSL modem and used therein for allocation of bits to carriers, can additionally be used for channel characterisation.

Furthermore, the present invention is very suitable for implementation in an Asymmetric Digital Subscriber Line (ADSL) system, or any similar system, e.g. a Very High Speed Digital Subscriber Line (VDSL) system.

An additional advantageous feature of the arrangement for estimating a transmission channel characteristic.

Hence, information suitable for use in the transmission channel characterisation method can be collected over a certain time interval, and can be fed back to the central office as soon as this time interval has elapsed.

BRIEF DESCRIPTION OF THE DRAWINGS

The above mentioned features of the invention will become more apparent and the invention itself will be best understood by referring to the following description of an embodiment taken in conjunction with the accompanying drawings.

DETAILED DESCRIPTION OF THE INVENTION

Figure 1:
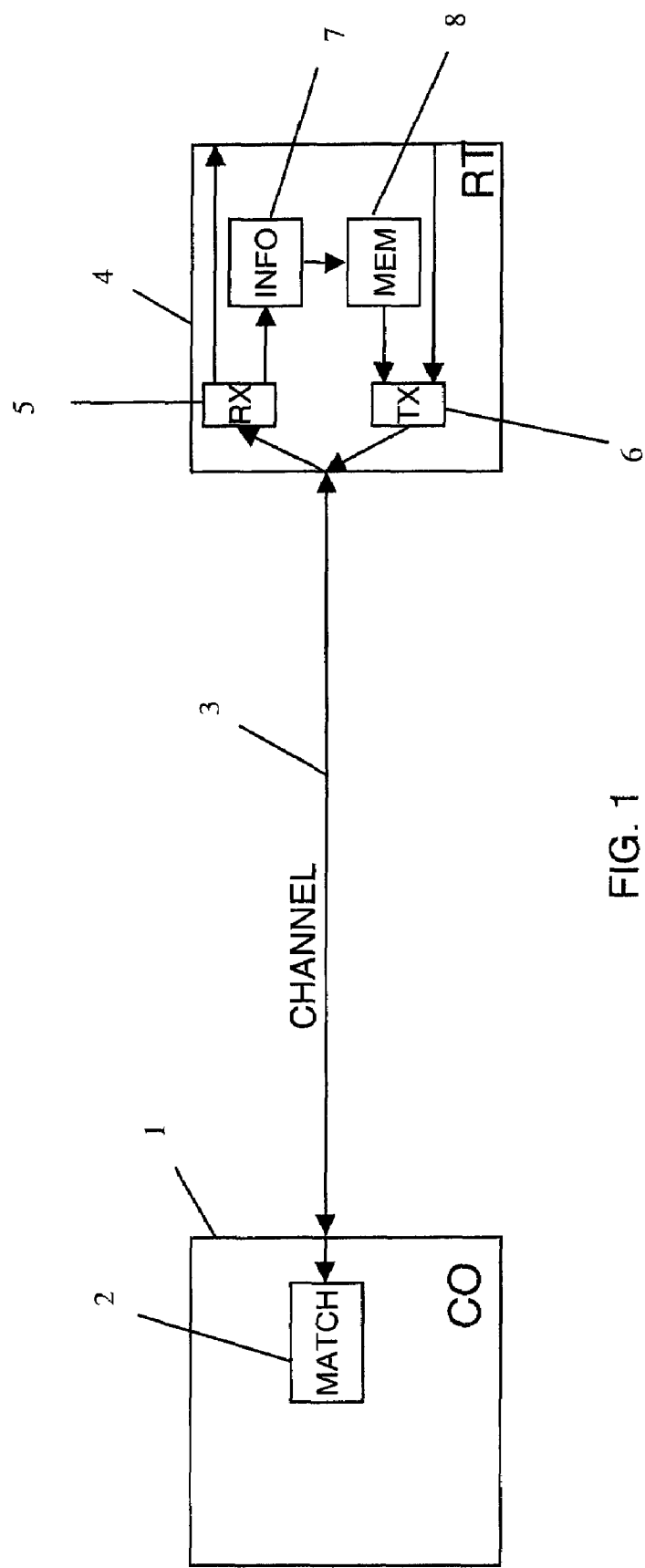
FIG. 1 is a functional block scheme of a telecommunication system wherein the method to estimate a transmission channel characteristic according to the present invention is applied.

In FIG. 1, the central office CO 1 and remote terminal RT 4 of an Asymmetric Digital Subscriber Line (ADSL) system are drawn. The remote terminal RT 4 in addition to traditional ADSL receiving circuitry that is supposed to form part of the receiver RX 5 and traditional ADSL transmitting circuitry that is supposed to form part of the transmitter TX 6 contains a channel information gathering unit INFO 7 and channel information memory MEM 8. The central office CO 1 on top of traditional ADSL transceiving circuitry, not drawn in the figure, contains a channel and modem matching unit MATCH 2.

The receiver RX 5 in the remote terminal RT 4 is coupled between an input/output port and an output terminal of this remote terminal RT 4, and further has an output coupled to the channel information gathering unit INFO 7. The transmitter TX 6 in the remote terminal RT 4 is coupled between an input terminal and the above mentioned input/output port of the remote terminal RT 4. To a second input terminal of the transmitter TX 6, the channel information memory MEM 8 is coupled. An output of the channel information gathering unit INFO 7 and an input of the channel information memory MEM 8 are interconnected. A twisted pair telephone line CHANNEL 3 serves as bi-directional physical communication medium between the remote terminal RT 4 and the central office CO 1. The remote terminal RT 4 is coupled to this telephone line CHANNEL 3 via the above mentioned input/output port. In the central office CO 1, an input of the channel and modem matching unit MATCH 2 is coupled to the telephone line CHANNEL 3.

In the drawn ADSL system digital data are transferred bi-directionally on top of telephone signals over the telephone line CHANNEL 3. At both the remote side and the central office side, a splitter separates received digital data from received telephone signals, applies the digital data to respectively the ADSL remote terminal RT 4 or ADSL central office CO 1, and applies the telephone signals to respectively the customer's telephone apparatus or a POTS (Plain Old Telephone Service) line-card. In FIG. 1, the splitters at the remote side and central office side, and the customer's telephone apparatus as well as the POTS line-card are not drawn because the present invention only has an impact on the ADSL central office CO 1 and the ADSL remote terminal RT 4.

For the operator of the drawn system, one of the problems is how to guarantee a certain service to the customer at the time of installation or later without exact knowledge of the channel characteristics of the telephone line CHANNEL 3. Because of the frequent changes in disturbances (e.g. the presence of a radio amateur) and line faults (e.g. due to water logging), databases containing information concerning the channel characteristics of telephone lines usually are outdated. Since the remote terminal RT 4 of the drawn ADSL system automatically collects information that is useful for channel characteristic information, access to this information by the operator enables the operator to track changes in the channel characteristics.

Figure 2:
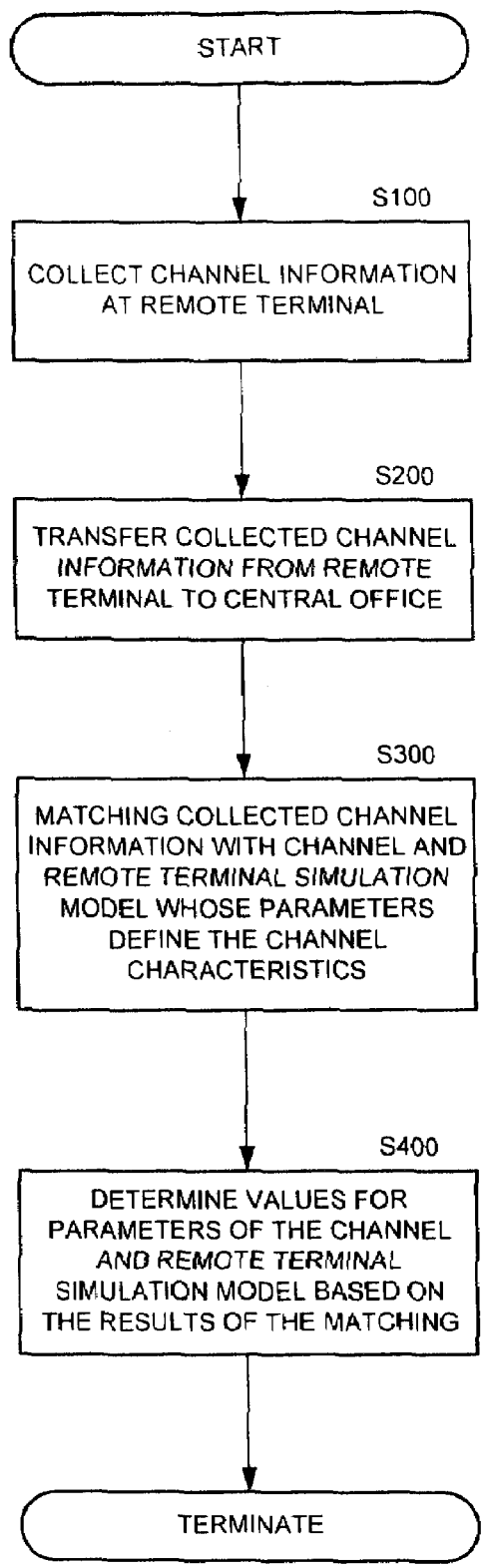
FIG. 2 is a flowchart of the method to estimate a transmission channel characteristic.

The remote terminal RT 4 in FIG. 1 is supposed to operate in accordance with Issue 2 of ANSI's T1E1.413 standard and consequently performs certain channel measurements such as a gain and phase measurement for each carrier transferred over the telephone line CHANNEL 3 and a signal to noise ratio (SNR) measurement for each carrier. The so obtained information is used for setting parameters of a time domain equaliser and frequency domain equaliser which typically forms part of the ADSL receiver RX 5 and for allocating data bits to carriers in the ADSL transmitter TX 6. Referring to FIG. 2, at S100, the channel information gathering unit INFO 7 collects the measured information and the information is temporarily stored in the channel information memory MEM 8. Thereafter, at S200, the ADSL transmitter TX 6 reads the channel information out of the channel information memory MEM 8 and sends the information to the central office CO 1 so that it is available at the operator's side for channel estimation purposes.

At S300, in the central office CO 1, the channel and modem matching unit MATCH 2 use a simulation model of the telephone line CHANNEL 3 and remote terminal RT 4 and matches the received information with this simulation model. The simulation model contains a number of parameters like the line attenuation, the length of the telephone line, length and location of bridged taps, water logging, and so on. By matching the simulation model with the information received from the remote terminal RT 4, at S400, the channel and modem matching unit MATCH 2 determines the values for the different parameters in the simulation model. These parameter values are an estimation of the channel characteristics where the operator can rely on to guarantee a certain service to the customer.

Since the measurements can be done by the remote terminal RT 4 on-line, the channel characteristics can be monitored in time so that each time the customer wants to install a new service, recent channel characteristic estimations are available to the operator allowing the operator to give quality guarantees concerning the newly installed service. The permanently available channel characteristic estimations moreover enable the operator to take appropriate measures in case of quality loss, to monitor changes to the customer's in-house network that may affect the quality of service, and to fast evaluate complaints of the customer concerning the quality of service.

The channel information gathering unit INFO 7, that is coupled to an output terminal of the ADSL receiver RX 5 in the above described embodiment, may be integrated within this ADSL receiver RX 5. Indeed, since an ADSL receiver RX 5 that operates in accordance with the specifications of ANSI's T1E1.413 Issue 2 standard collects channel information at initialisation for use in the bit allocation algorithm and for setting equaliser taps, channel information gathering equipment INFO 7 may in certain embodiments of the invention be integrated in the receiver circuitry RX 5.

Although the embodiment of the present invention illustrated by FIG. 1 contains a channel information memory MEM 8, provision of such a channel information memory MEM 8 is not an absolute requirement for implementation of the present invention. Indeed, without the channel information memory MEM 8, the channel information collected by the remote terminal RT 4 would be fed back instantly to the central office CO 1, whereas with a channel information memory MEM 8, the channel information can be collected during a certain time interval and can be fed back at certain time instants in between the time intervals wherein the channel information is collected. When providing a channel information memory MEM 8, the collected channel information may be sent automatically at regular time intervals to the central office CO 1 or may be sent to the central office CO upon request of the latter one.

The channel and remote terminal matching unit MATCH 2 may form part of the central office CO 1, as is the case for the embodiment of the invention drawn in the figure, but alternatively may be a separate unit connected to an operator terminal of the central office CO 1.

The applicability of the present invention is not limited to any particular physical communication medium in between the central office CO 1 and the remote terminal RT 4 or any particular physical layer transport protocol. Thus, instead of a twisted pair telephone line, a coaxial cable, an optical fibre, a radio link, a satellite connection, or even a hybrid transmission medium such as a hybrid coax/optical fibre link may serve as communication medium between the central office CO 1 and remote terminal RT 4, and evidently, instead of the Asymmetric Digital Subscriber Line (ADSL) protocol, any other physical layer protocol, e.g. the VDSL (Very High Speed Digital Subscriber Line) protocol or the Hybrid Fibre Coax (HFC) protocol may be adopted in the system wherein the present invention is implemented.

Furthermore, the embodiments of the present invention are described above in terms of functional blocks. From the functional description of these blocks it will be obvious for a person skilled in the art of designing electronic devices how embodiments of these blocks can be manufactured with well-known electronic components. A detailed architecture of the contents of the functional blocks hence is not given for most of them.

While the principles of the invention have been described above in connection with specific apparatus, it is to be clearly understood that this description is made only by way of example and not as a limitation on the scope of the invention.

What is claimed is:

1. A method to estimate a transmission channel characteristic of a transmission channel between a central office and a remote terminal, said method comprising the steps of:
    a. collecting at said remote terminal channel measurements performed at a number of frequencies;
    b. transferring said channel measurements from said remote terminal to said central office; and
    c. estimating said transmission channel characteristic on the basis of said transferred channel measurements, and
    wherein said channel measurements comprise signal to noise ratio measurements and attenuation measurements, and
    wherein said transmission channel characteristic comprises bridged tap and radio frequency interference.

2. A remote terminal comprising:
    a channel information gathering component for making transmission channel measurements at a number of frequencies, and
    transmission component which is adapted to obtain said transmission channel measurements from said channel information gathering component and to transfer said transmission channel measurements for the purpose of estimating a channel characteristic of said transmission channel,
    wherein said transmission channel measurements comprise signal to noise ratio measurements and attenuation measurements.

3. A transmission channel characteristic estimating unit for estimating a transmission channel characteristic of a transmission channel, said transmission channel characteristic estimating unit comprising:
    a channel characteristic estimating component which estimates said transmission channel characteristic on the basis of channel measurements performed at a number of frequencies, wherein said transmission channel characteristic comprises bridged tap and radio frequency interference; and
    a channel measurement component for performing said channel measurements.

\* \* \* \* \*